United States Patent [19]

Morimoto et al.

[11] 4,098,919

[45] Jul. 4, 1978

[54] PROCESS FOR PRODUCING A THIN FLUORESCENT FILM FOR ELECTROLUMINESCENCE

[75] Inventors: Kiyoshi Morimoto; Yukihiko Utamura, both of Mobara; Toshinori Takagi, Nagaokakyo, all of Japan

[73] Assignee: Futaba Denshi Kogyo K.K., Japan

[21] Appl. No.: 585,597

[22] Filed: Jun. 10, 1975

[30] Foreign Application Priority Data

Jun. 10, 1974 [JP] Japan .................................. 49-65077

[51] Int. Cl.² ........................ C09K 11/10; C09K 11/14
[52] U.S. Cl. ........................................ 427/42; 427/69; 427/250; 427/294
[58] Field of Search ................... 427/42, 66, 70, 248, 427/294, 69, 250

[56] References Cited

U.S. PATENT DOCUMENTS

| | | | |
|---|---|---|---|
| 3,373,278 | 3/1968 | Cilyo | 427/42 X |
| 3,434,863 | 3/1969 | Hansen et al. | 427/42 |
| 3,900,585 | 8/1975 | Matsubara | 427/39 X |

*Primary Examiner*—Bernard D. Pianalto
*Attorney, Agent, or Firm*—Oblon, Fisher, Spivak, McClelland & Maier

[57] ABSTRACT

A process for producing a thin fluorescent film for electroluminescence includes the steps of heating a raw material, composed of a base material and an activator, within an enclosed type crucible so as to generate a mixed vapor, injecting the mixed vapor into a vacuum zone through means of an injection nozzle, projecting an electron beam into the injected mixed vapor so as to ionize the mixed vapor, accelerating the ionized mixed vapor by means of an electric field, and permitting the accelerated ionized mixed vapor to collide with a base plate so as to form a vapor-deposited film upon the base plate.

5 Claims, 4 Drawing Figures

PROCESS FOR PRODUCING A THIN FLUORESCENT FILM FOR ELECTROLUMINESCENCE

BACKGROUND OF THE INVENTION

1. Field of the Invention

The present invention relates generally to electroluminescence, and more particularly, to a novel method of producing a thin fluorescent film for electroluminescence for use, for example, within the manufacture of an electroluminescent cell.

2. Description of the Prior Art

Conventional methods of producing thin fluorescent films for electroluminescence generally employ the embedding process or other heat-treating processes, wherein activators, such as for example, Al, Ag, Au, Cu, Mn and Pb, and coactivators, such as for example, NaCl, $ZnCl_2$, $NH_4Cl$, $NH_4I$, Al, Cu and Ga, are added to base materials, such as for example, ZnS, ZnSe and CdS, so as to form evaporated films. However, such conventional methods have several disadvantages in that they cannot produce fluorescent films for electroluminescence which emit light by the action of direct current, unless coactivators are in fact added thereto as mentioned above. For example, a fluorescent film produced by the addition of only Mn, as an activator, to a base material of ZnS, can emit light as a result of the application of AC voltage thereto, however the same does not emit light as a result of the application of DC voltage thereto. It is well known, however, that a fluorescent film, produced by means of the addition of Cu, Ce, or the like, as a coactivator, as well as an activator of Mn, to a base material of ZnS, can emit light by means of an application of DC voltage.

It is also evident that if the evaporation process or the like, which is utilized to vapor-deposit a base material, such as for example, ZnS upon a base plate, such as for example, a glass plate, is simultaneously or alternately used with the ionization injection process which ionizes and accelerates an activator, such as for example, Mn and then injects the ions thereof, a fluorescent film for electroluminescence can in fact be obtained which emits light as a result of the application of DC voltage thereto without adding the above-mentioned coactivators, such as for example, Cu and Ce. However, such a method has several disadvantages in that it requires a complicated and expensive apparatus provided with an ionization-injection mechanism in addition to a vacuum evaporation mechanism which is extremely difficult to operate.

SUMMARY OF THE INVENTION

Accordingly, one object of the present invention is to eliminate the above-mentioned disadvantages of the conventional methods of producing fluorescent films for electroluminescence.

Another object of the present invention is to provide a novel method of producing an excellent fluorescent film which can emit light as a result of the application of DC voltage thereto, without using coactivators.

The foregoing and other objects are achieved according to the present invention through the provision of a method of producing a fluorescent film for electroluminescence which comprises the steps of heating raw materials, composed of at least a base material and an activator or components thereof, within an enclosed crucible so as to generate a mixed vapor, injecting the mixed vapor into a vacuum zone through means of at least one nozzle provided upon the crucible, radiating an electron beam so as to ionize at least a portion of the injected mixed vapor, accelerating the ionized mixed vapor within an electric field, and projecting the accelerated ionized mixed vapor onto a base plate so as to form a vapor-deposited fluorescent film thereon.

BRIEF DESCRIPTION OF THE DRAWINGS

Various other objects, features, and attendant advantages of the present invention will be more fully appreciated as the same becomes better understood from the following detailed description when considered in connection with the accompanying drawings, wherein.

DETAILED DESCRIPTION OF THE PREFERRED EMBODIMENT

Figure 1:
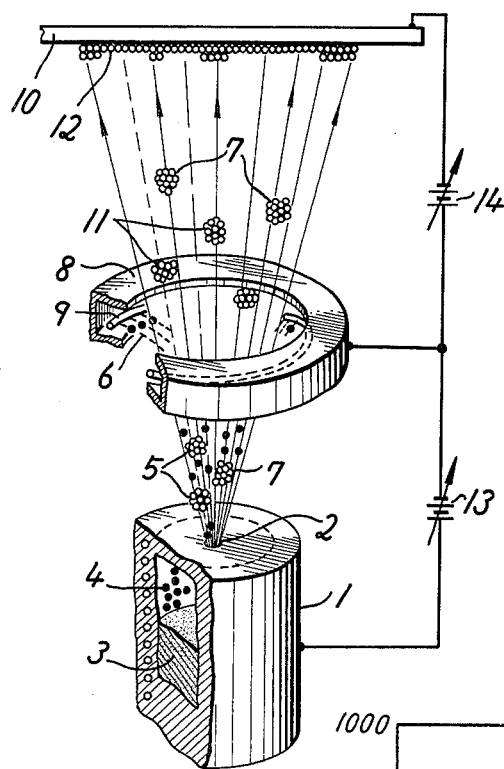
FIG. 1 is a schematic partly cross-sectional view of the primary portion of an apparatus to be utilized in producing a fluorescent film for electroluminescence in accordance with the present invention, and showing the operative principles thereof.

Referring now to FIG. 1, the primary portion of an apparatus for practicing the process of the present invention is illustrated, and the same is to be operated under high vacuum conditions, such as for example, $10^{-2}$ Torr or less, and preferably, $10^{-4}$ Torr or less. An enclosed crucible 1 is provided with one or more nozzles 2, for projecting vapor therefrom and into the vacuum zone, and crucible 1 is constructed such that the contents thereof are heated by means of electric heating, electronic impact, high frequency induction heating, or the like. The crucible 1 contains raw material 3 composed of a base material, such as for example, ZnS and an activator, such as for example, Mn at a ratio of 0.01 – 10% by weight, and preferably at a ratio of 0.03 – 0.1% by weight.

Within the present instance, a compound, such as for example, ZnS is used as the base material, however, the raw material 3 may be composed of simple substances, such as for example, the elements of the compounds. Accordingly, the raw material 3 may be composed of a mixture of simple substances of three kinds of elements, such as for example, Zn, S and Mn. In the cases where Zn, S and Mn are used, the mixing ratios thereof are 1 – 99% by weight, 1 – 99% by weight, and 0.01 – 50% by weight, respectively, and preferably, mixing ratios of 20 – 80% by weight, 20 – 80% by weight, and 0.02 – 10% by weight, respectively.

The above-mentioned crucible 1 is heated to a temperature of approximately 1,000° C or more, and preferably at a temperature of 1,200° C or more, and thus, a mixed vapor 4 of the raw material 3, which vapor 4 has a temperature corresponding to the aforenoted heating temperature and a high vapor pressure, prevails within the space of the crucible 1 disposed above material 3. The mixed vapor 4 of the raw material 3 is then injected into a high vacuum zone through at least one nozzle 2 provided within the upper surface of crucible 1.

The mixed vapor 4 is, during this injection phase of the process, adiabatically expanded so as to attain a supercooled state, and within such state, the thermal energy of the mixed vapor particles is extremely decreased and, therefore, attractive forces between the particles work effectively to form massive atom groups or clusters 5.

In addition, the condensation effect within the zone of the crucible 1 wherein the mixed vapor 4, under high vapor pressure, and the raw material, reside, also facilitates the formation of the clusters 5. The number of atoms forming the clusters 5 varies with and is dependent upon the kind of raw material used, the size of the injection nozzle, the temperature of the crucible, and the like, yet experiments have shown that it is most stable and practical to form the clusters 5 so that the number of atoms thereof may fall within the range from $10^2 - 10^3$.

An electron beam 6 is projected onto the clusters 5 so as to ionize at least one of the atoms thereof and thereby form an ionized cluster 7. Within this state, the sectional area for collision of electrons is proportional to the mass of the clusters 5. Therefore, the clusters 5 composed of hundreds of atoms has a large sectional area for collision of electrons, and, accordingly ionization is carried out very effectively and efficiently.

One of the various possible forms of the electron source mechanism for obtaining the electron beam 6 for ionizing the clusters 5 is shown within FIG. 1 as an example, and the same is seen to comprise a generally hollow doughnut type acceleration electrode assembly 8 disposed above the injection nozzle 2 of the crucible 1 so as to accelerate the ionized clusters 7. The acceleration electrode assembly 8 contains therein a filament coil 9 for electron emission, and the same is adapted to focus the electron beam 6 onto the injection nozzle 2 and the mixed vapor 4 of the raw material prevailing within the neighborhood of the injection nozzle 2, which mixed vapor has been projected from the injection nozzle 2 and contains the clusters 5.

If the acceleration electrode assembly 8 is maintained, relative to the crucible 1, at a high negative voltage of $-100$ V or more, and preferably at a voltage of $-500$ V to 10KV and, in addition, if the filament coil 9 is heated, then the electron beam 6 projected from the filament coil 9 is accelerated towards and focused within the neighborhood of the injection nozzle 2 so as to effectively collide with the clusters 5 and thereby ionize the same.

The ionized clusters 7 are then accelerated in the direction opposite that of the electron beam 6 by means of the action of the same electric field of negative voltage as that given by the acceleration electrode assembly 8 for accelerating the electron beam 6, and consequently, clusters 7 move at high speed towards a base plate 10, such as for example, a glass and plastic plate after passing through the center of the hollow doughnut type acceleration assembly 8.

Neutral clusters 11 which have not been subjected to the electron beam 6 also move towards the base plate 10 as a result of the kinetic energy thereof which they have when they are projected from the nozzle 2. The ratio between the numbers of the neutral clusters 11 and the ionized clusters 7 can be adjusted by optionally selecting the strength of the electron beam 6, the acceleration energy thereof, and the like. The strength of the electron beam 6 may be selected to be 10 mA or more, and preferably to be 10 mA - 300 mA. The acceleration energy of the electron beam 6, namely, the negative voltage imparted to the hollow doughnut type acceleration assembly 8, is preferably between $-100$V to $-300$V, from the standpoint of ionization efficiency, however, it is preferably $-500$V or less from the standpoint of the desirable acceleration of the electrons as well as that of the ions.

The above-mentioned acceleration electrode assembly 8 may of course be variously modified. For example, a plurality of acceleration electrode assemblies or electron emission sources may be provided, or, alternatively and in addition to the above-mentioned mechanism which provides for the acceleration of both electrons and ions, one or more stages of ion acceleration portions may be added. Still further, the filament system for electron emission, and the acceleration electrode for electron acceleration, may be separately provided.

The ionized clusters 7 and the neutral clusters 11 moving towards the base plate 10 both collide with the base plate 10 so as to vapor-deposit thereon and thereby form a vapor-deposited film 12. At this time, a greater portion of the large kinetic energy of the ionized clusters 7 is converted into thermal energy so as to heat the base plate 10, however, the base plate 10 is not heated uniformly, but on the contrary, is heated locally within those portions, and the adjacent areas thereof, upon which the vapor-deposition takes place. Thus, the vapor-deposited film 12 rapidly becomes a single crystal.

The bonding strength between the particles of the clusters depends upon van der Waals forces and, therefore, is weak. For this reason, when the clusters collide with the base plate 10, the same are disintegrated into individual atoms which move onto the base plate 10 and condense at stable points thereof so as to form the vapor-deposited film 12 having good crystallization properties. In addition, when the ionized clusters 7 collide with the base plate 10, the surface of the base plate 10 is subjected to spattering and therefore is purified owing to the kinetic energy of the clusters 7. Thus, the vapor-deposited film 12 exhibits a high adhesion force. The above-mentioned processes occurring simultaneously with the collision between the base plate 10 and the neutral clusters 11 thus creat the vapor-deposited film 12 upon the base plate 10 which film has a high adhesion force and good crystallization properties.

The clusters 7 are also accelerated by means of a negative voltage, provided by means of a battery type power source 13, which is applied to the acceleration electrode 8, and, if necessary, also by means of an additional negative voltage, provided by means of another battery type power source 14, which is applied to the base plate 10, and consequently, the same are provided with a large kinetic energy with which they collide with the base plate 10. Therefore, an effect analogous to ion injection can be expected, namely, the same process as that carried out when Mn ions are injected into ZnS material is expected simultaneously with the formation of the vapor-deposited film 12. Accordingly, ions of an activator, such as for example, Mn are injected deeply into the base material, such as for example, ZnS. They effectively become substituent atoms, which act as light emissive nuclei, by annealing after the formation of the vapor-deposited film, and thus, light emission becomes possible by means of a D.C. excitation without utilizing any coactivators.

As just noted, within the state in which the vapor-deposited film remains as it was formed, some of the activator ions become substituent atoms which act as light emissive nuclei, however, some of the atoms remain as so-called "clearance atoms" which remain in crystals as they were injected into the base material, and it has been noted that the above-mentioned annealing is very effective for converting such "clearance atoms" into substituent atoms which act as light emissive nuclei, and such a process is preferably carried out at a temperature approximately 400° – 600° C.

When Mn ions, or the like, are injected into an insulating material, such as for example, ZnS, a special filament for neutralizing surface electric charges must be usually provided, because, otherwise, minor sparks may occur due to the accumulation of positive electric charges and, in an extreme case, repulsion between the positive electric charges may render the injection process impossible. However, in the case of the present invention within which ionized clusters are injected, only one of a number of atoms forming an ionized cluster is ionized and, therefore, the specific electric charge $e/m$, wherein $e$ is the electric charge, and $m$ is the mass, is small and, consequently, as a result, injection into the insulating material can be carried out very easily.

Figure 2:
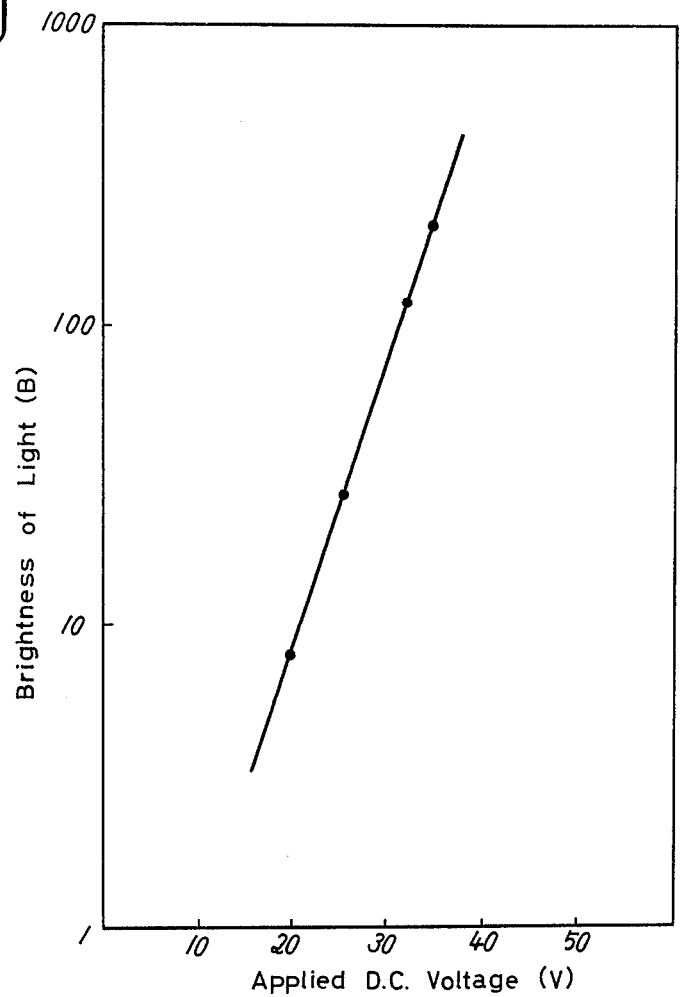
FIG. 2 is a diagram showing the relationship between the applied voltage and the brightness of the light emitted from a fluorescent film for electroluminescence produced in accordance with the present invention.

As mentioned above, the fluresceent film for electroluminescence obtained by forming the vapor-deposited film 12 (ZnS:Mn) upon the base plate 10 can emit light as a result of a D.C. excitation. Referring now to FIG. 2, the diagram thereof shows the relationship between the D.C. applied voltage V and the brightness of light B in connection with the fluorescent film for electroluminescence (ZnS:Mn) according to the present invention. This fluorescent film for electroluminescence was formed under the conditions within which the acceleration voltage was − 1,000 V, the base plate temperature was room temperature, and the temperature and time period for the aforenoted annealing process, after the formation of the vapor-deposited film, were 500° C and approximately 1 hour, respectively. From the diagram it will be appreciated that the applied voltage has a linear relationship with respect to the logarithmic values of the brightness of the light emitted from the fluorescent film for electroluminescence according to the present invention.

Figure 3:
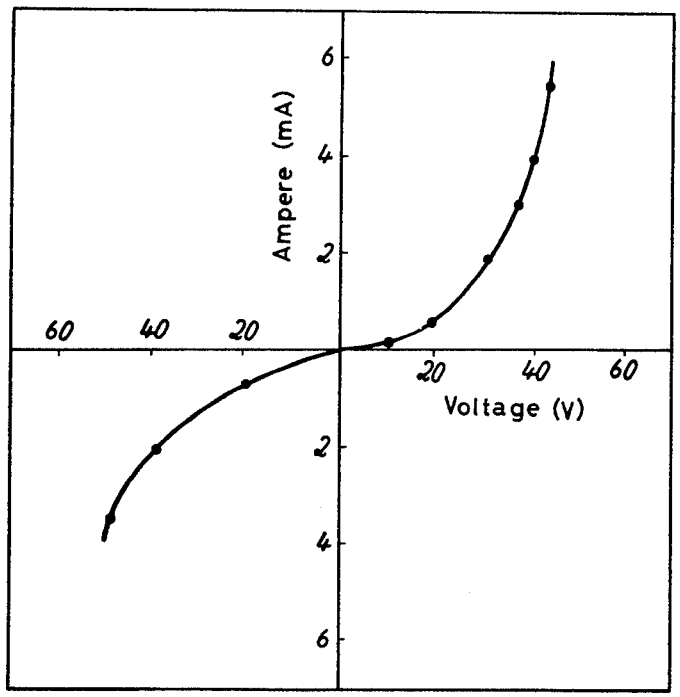
FIG. 3 is a diagram showing the voltage-ampere characteristics of a fluorescent film for electroluminescence produced in accordance with the present invention.

Similarly, referring to FIG. 3, the diagram thereof shows an example of the voltage-ampere characteristics of a fluorescent film for electroluminescence (ZnS:Mn) formed upon the surface of the nether-coating of a glass base plate. As is apparent from this diagram, the characteristics are of a non-rectified type and show low impedance type elements.

Figure 4:
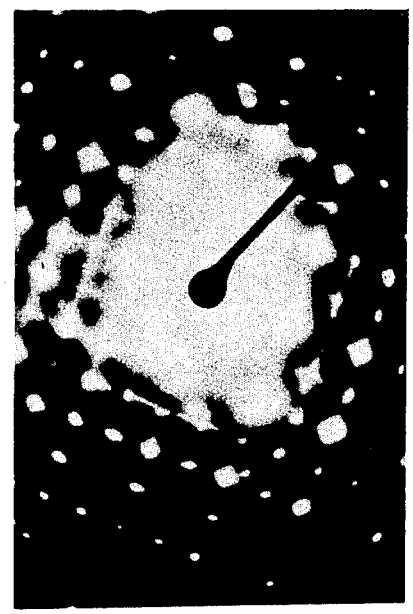
FIG. 4 is a photograph of a fluorescent film for electroluminescence produced in accordance with the present invention, as taken by means of a transmission type electron microscope.

With reference to FIG. 4, which is a photograph of a fluorescent film (ZnS:Mn) formed upon a rock-salt base plate by means of the so-called ionized cluster beam evaporation process according to the present invention, as taken by means of a transmission type electron microscope, the fluorescent film thereof was formed under the conditions within which the base plate was heated to a temperature of 250° C and the acceleration energy was − 1,000 V. From this photograph, the appearance of a single crystal can be seen.

Within the above-mentioned embodiment, description was made as to the instance within which the raw material was composed of base materials and activators, compounds including simple substances of the elements thereof, or the elements thereof. However, embodiments other than those as above-mentioned are of course possible. What is of primary importance within the present invention is the use of base materials and activators as the raw material. In addition to the base materials and activators, coactivators, such as for example, NaCl, $ZnCl_2$, $NH_4Cl$, $NH_4I$, Al, Cu and Ga, may of course be added.

It is additionally noted that within the above-mentioned embodiment of the present invention, description was also made as to the case within which the number of heating chambers within the enclosed type crucible for containing the raw material was only one, however the number of such heating chambers need not necessarily be restricted to one. An enclosed type crucible may be utilized which has at least one common projection nozzle and a plurality of heating chambers. In using such a crucible, the raw material, whose components are base materials and activators, or simple substances of elements thereof, or compounds of elements thereof, is classified into at least two or more groups according to the kinds of the components. The groups are separately deposited into the above-mentioned plurality of heating chambers and are separately heated so as to generate respective vapors.

This crucible is adapted to inject a mixed vapor of the above-mentioned respective vapors into a high vacuum zone through means of the above-mentioned common injection nozzle, and even if the vapor-generating heating temperature, that is, the heating temperature for vapor pressure, varies considerably with the kinds of elements or compounds forming the raw material, the materials can nevertheless be heated within separate heating chambers to suitable respective temperatures. As a result, the present invention can obtain an excellent effect in that the mixing ratio of the raw material can be selectively adjusted so as to obtain a desired mixed vapor projected from the common injection nozzle.

As mentioned above, the process for producing a fluorescent film for electroluminescence according to the present invention is a novel process utilizing the ionized cluster beam method. This process has a number of excellent features and effects as follows:

(1) Within conventional methods, such as for example, an embedding process, coactivators must be added in addition to the base materials and the activators in order to obtain a fluorescent film for electroluminescence which can emit light as a result of a D.C. excitation.

However, according to the present invention, a high quality fluorescent film for electroluminescence which is able to emit light by means of a D.C. excitation can be obtained utilizing only base materials and activators. A possible use for various kinds of electroluminescent cells is thus highly expected.

(2) According to the present invention, an ion injection-like process and the formation of a film by means of evaporation utilizing base materials and activators can be simultaneously carried out in terms of both time and space. Therefore, the production system is extremely simplified and, as a result, the operation becomes very easy. Namely, the present invention has excellent effects with respect to operational efficiency, economy, and the like.

(3) According to the present invention, the fluorescent film for electroluminescence is a vapor-deposited film formed upon a base plate accompanyong the ion injection-like process and a surface-purifying process, and, therefore, is high in adhesion force with respect to the base plate, excellent in crystallization properties, high in quality, and excellent in durability.

(4) The process for producing a fluorescent film for electroluminescence according to the present invention is an evaporation process using ionized cluster injection. Therefore, it is superior in adhesion properties to a conventional vacuum evaporation process, and, in addition, it can form a vapor-deposited film upon a base plate much more effectively than a conventional ion evaporation process.

(5) The fluorescent film formed according to the present invention is a very thin film vapor-deposited upon a base plate, and therefore can be used for very thin electroluminescent panels, photo-amplifiers, electroluminescent displays, and the like.

Obviously, many modifications and variations of the present invention are possible in light of the above teachings. It is to be understood therefore that within the scope of the appended claims, the invention may be practiced otherwise than as specifically described herein.

What is claimed as new and desired to be secured by Letters Patent of the United States is:

1. A process for producing a thin fluorescent film for electroluminescence coated upon a base plate, which comprises the steps of:
   (a) placing a base material and an activator within an enclosed-type crucible having at least one injection nozzle;
   (b) placing the thus charged crucible into a vacuum chamber;
   (c) heating said base material and activator so as to generate a mixed vapor within said crucible having a pressure greater than the vacuum outside the crucible;
   (d) injecting said mixed vapor into said vacuum zone through said injection nozzle provided upon said crucible to adiabatically expand said mixed vapor so as to attain a supercooled state and form a mixed vapor comprising atom groups or clusters;
   (e) projecting an electron beam into said injected mixed vapor comprising said atom groups or clusters so as to thereby ionize at least a portion of said atom groups or clusters;
   (f) accelerating said ionized atom groups or clusters by means of an electric field; and
   (g) permitting said mixed vapor comprising said ionized and accelerated atom groups or clusters and the non-ionized atom groups or clusters to collide with said base plate so as to thereby form a vapor-deposited film, acting as a fluorescent film, upon said base plate.

2. The process as set forth in claim 1, wherein: said base material is composed of at least one of the compounds ZnS, ZnSe, or CdS.

3. The process of claim 1 wherein said base material is selected from the group consisting of a mixture of elemental zinc and sulfur, elemental zinc and selenium and elemental cadmium and sulfur.

4. The process of claim 1, wherein said base material is selected from the group consisting of ZnS in admixture with elemental zinc and sulfur, ZnSe in admixture with elemental zinc and selenium and CdS in admixture with elemental cadmium and sulfur.

5. The process as set forth in claim 1, wherein:
   said enclosed type crucible has a plurality of heating chambers and at least a common injection nozzle,
   said base material and activator are separately placed within said plurality of heating chambers separately according to their components which are separately heated therein so as to generate respective vapors; and
   said respective vapors are mixed and injected from said common injection nozzle into said vacuum zone.

* * * * *